US006958509B2

(12) United States Patent
Körner et al.

(10) Patent No.: US 6,958,509 B2
(45) Date of Patent: Oct. 25, 2005

(54) INTEGRATED SEMICONDUCTOR PRODUCT COMPRISING A METAL-INSULATOR-METAL CAPACITOR

(75) Inventors: Heinrich Körner, Bruckmühl (DE); Michael Schrenk, Diessen am Ammersee (DE); Markus Schwerd, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/865,000

(22) Filed: Jun. 10, 2004

(65) Prior Publication Data

US 2004/0256654 A1 Dec. 23, 2004

Related U.S. Application Data

(63) Continuation of application No. PCT/EP02/12213, filed on Oct. 31, 2002.

(30) Foreign Application Priority Data

Dec. 13, 2001 (DE) .......................................... 101 61 285

(51) Int. Cl.⁷ ............................................. H01L 27/108
(52) U.S. Cl. ....................... 257/306; 257/301; 257/306; 257/528; 438/210; 438/241; 438/253
(58) Field of Search .................................. 257/301, 306, 257/528; 438/210, 241, 253

(56) References Cited

U.S. PATENT DOCUMENTS

| 6,086,951 A | 7/2000 | Lin et al. ..................... 427/253 |
| 6,184,551 B1 | 2/2001 | Lee et al. ..................... 257/310 |
| 6,271,084 B1 | 8/2001 | Tu et al. ....................... 438/253 |
| 6,329,234 B1 * | 12/2001 | Ma et al. ..................... 438/210 |
| 6,391,707 B1 * | 5/2002 | Dirnecker et al. ........... 438/250 |

FOREIGN PATENT DOCUMENTS

| DE | 199 45 939 A1 | 4/2001 | ........... H01L/27/08 |
| EP | 1 130 654 A1 | 3/2000 | ........... H01L/29/92 |
| GB | 2 353 404 A | 2/2001 | ........... H01L/21/02 |

OTHER PUBLICATIONS

Liu, R. et al.; "Single Mask Metal–Insulator–metal (MIM) Capacitor with Copper Damascene Metallization for Sub–0.18 μm Mixed Mode Signal and System–on–a–Chip (SoC) Applications"; Lucent Technologies Bell Laboratories; pp. 111–113, 2000.

Mahnkopf, R. et al.; "'System on a Chip' Technology Platform for 0.18 μm Digital, Mixed Signal & eDRAM Applications"; Infineon Technologies Corp; pp. 35.2.1–35.2.4, 1999.

* cited by examiner

Primary Examiner—David Nelms
Assistant Examiner—Mai-Huong Tran
(74) Attorney, Agent, or Firm—Baker Botts L.L.P.

(57) ABSTRACT

To fabricate an integrated semiconductor product with integrated metal-insulator-metal capacitor, first of all a dielectric protective layer (5) and a dielectric auxiliary layer (16) are deposited on a first electrode (2). The protective layer and the auxiliary layer (16) are then opened up (17) via the first electrode. Then, a dielectric layer (6) is produced, and the metal track stack (7, 8, 9) for the second electrode is then applied to the dielectric layer (6). This is followed by the patterning of the metal-insulator-metal capacitor using known etching processes. This makes it possible to produce dielectric capacitor layers of any desired thickness using materials which can be selected as desired. In particular, this has the advantage that via etches can be carried out significantly more easily than in the prior art, since it is not necessary to etch through the residual dielectric capacitor layer above the metal tracks.

14 Claims, 3 Drawing Sheets

INTEGRATED SEMICONDUCTOR PRODUCT COMPRISING A METAL-INSULATOR-METAL CAPACITOR

CROSS REFERENCE TO RELATED APPLICATION

This application is a continuation of copending International Application No. PCT/EP02/12213 filed Oct. 31, 2002 which designates the United States, and claims priority to German application no. 101 61 285.0 filed Dec. 13, 2001.

TECHNICAL FIELD OF THE INVENTION

The invention relates generally to an integrated semiconductor product with interconnects and a metal-insulator-metal capacitor. The present invention relates in particular to an integrated semiconductor product with interconnects which include copper as an essential constituent.

BACKGROUND OF THE INVENTION

High-frequency circuits in BIPOLAR, BICMOS and CMOS technology require integrated capacitors with a high voltage linearity, accurately settable capacitances and in particular low parasitic capacitances. The conventional MOS or MIS capacitors which have been used hitherto have an unsatisfactory voltage linearity on account of voltage-induced space charge regions. The short distance from the substrate also entails numerous parasitic capacitances.

These difficulties can be avoided by using what are known as metal-insulator-metal capacitors (MIM capacitors), which are usually arranged between two metallization levels and are therefore at a considerably greater distance from the substrate. As far as possible, these metal-insulator-metal capacitors should be integrated in the existing concepts for multilayer metallization without changing and influencing the adjacent interconnects.

Modern multilayer metallizations are preferably fabricated using the "Damascene" process. In this process, the structures for future interconnects or vias are etched into the intermetal dielectric. Then, these structures are filled with the interconnect material (e.g. copper). The metal remaining on the surface is then removed again in a final chemical mechanical polishing (CMP) step. One advantage of the "Damascene" technique is that it can be used even for very small feature sizes for which reactive ion etching (RIE) can no longer be used. Furthermore, the "Damascene" technique is also suitable for all metals which, for example like copper, do not form any highly volatile compounds and therefore cannot be patterned by means of RIE processes.

Previous approaches, such as for example those which are known from the European patent application EP 1 130 654 A1 and the articles "Single Mask MIM Capacitor with Cu Damascene Metallization for sub-0.18 µm Mixed Mode Signal and System-on-a-Chip Applications", IEEE (2000), pp. 111 ff. by Kiu et al. and "System on a Chip Technology Platform for 0.18 µm Digital, Mixed Signal & eDRAM Applications", Infineon Techn. Corp. and IBM Microelectronics Div. by R. Mahnkopf et al., use the materials silicon dioxide and/or silicon nitride, which are well characterized and known in the microelectronics industry, as dielectrics.

However, the dielectric constants k of these materials are not especially high, at approximately four to seven. Furthermore, on account of the use in the multilayer metallization, they have to be deposited using plasma (PECVD) processes. These processes are typically distinguished by high deposition rates, but also by high defect densities and lower layer qualities. Therefore, in plasma processes it is virtually impossible to produce layers of less than 60 nm with a reproducible thickness and sufficient quality.

Moreover, in the integration concepts cited above, the top electrode is patterned with the aid of a top electrode etch, which has to be stopped in the dielectric of the capacitor. For this reason, these processes absolutely must have a dielectric layer with a sufficient thickness of at least 60 nm.

FIG. 4 shows an excerpt from a cross section through an integrated semiconductor product having an MIM capacitor according to the prior art. In a lower intermetal dielectric 1, lower interconnects 20 are connected by means of vias 21 to a middle level of interconnects 3, 19. The interconnects 3, 19, 20 and the vias 21 are fabricated by means of the "Damascene" technique.

Then, a 50 nm thick layer of TaN is applied by means of PVD deposition, as lower electrode 2 of the capacitor, to the planarized surface of the middle interconnect level. A layer which is once again approx. 60 nm thick is then applied as capacitor dielectric 6 to the layer of TaN. This layer 6 may, for example, consist of $SiO_2$ which is deposited by means of CVD. Above this, the second electrode 8 of the capacitor is applied; it may be formed, for example, by a 50 nm thick TaN layer.

This is followed by the patterning of the layer stack which is intended to form the capacitor, the etching stop in the region of the capacitor (on the left-hand side of the figure) having to take place on the intermetal dielectric, while the etching stop in the region of the central interconnect 3 takes place on copper. After the patterning, a passivation layer 12 of $Si_3N_4$ is deposited. Vias 13 are used to make contact with the central interconnect 3 and the upper electrode 8 of the capacitor. These vias 13 are formed in an upper intermetal dielectric 11 and are closed off by upper interconnects 14. The surface formed in this way is once again planarized by means of CMP.

In particular the required etching stop on copper and the subsequent removal of resist with uncovered copper cause considerable process engineering difficulties.

There is a considerable risk of the quality of the copper track 3 being adversely affected. A further problem is caused by the capacitor stack 2, 6, 8 being completely etched clear. Undercut etching results in an increased likelihood of failure being caused by possible short circuits at the vertical edges.

The problem of the etching stop on copper has already been recognized in the prior art. According to a solution which is already known, it is proposed for a thin layer of $Si_3N_4$ to additionally be deposited immediately after the planarization of the central interconnect level 1, 3, 19. Then, the $Si_3N_4$ layer is opened up at the location at which the MIM capacitor is provided. The photoresist required for this step is stripped with the copper track 19 uncovered, (left-hand side of FIG. 4).

With the process described above, the process engineering problem arises that when opening up the $Si_3N_4$ layer, the photoresist has to be removed with the copper track uncovered. Since copper is susceptible to oxidation, therefore, it is necessary to reckon with a deterioration in the interconnect quality. Moreover, an additional patterning step and also an additional photomask are required compared to the process which was outlined first, and this in turn significantly increases the effort and cost involved in the process sequence.

In the integrated semiconductor product described in EP 1 130 654 A1, the existing copper track 19 is used as lower electrode 2. A layer stack comprising capacitor dielectric and the material for the upper electrode 8 is deposited on the surface which has been planarized by means of CMP technology. Then, this stack is patterned, it being necessary for the etching operation to be stopped in the capacitor dielectric 6.

Since in this method the etching operation has to stop in the capacitor dielectric, there are strict limits with regard to the thickness and the capacitor material used for the dielectric 6. Since, moreover, the dielectric is deposited directly on the extremely sensitive copper surface, the susceptibility of copper to oxidation means that plasma processes which use oxygen as a reaction partner cannot be used to deposit $SiO_2$. Consequently, $SiO_2$ and other oxygen-containing materials cannot be used as capacitor dielectrics in this process.

Furthermore, the surface area-specific capacitance of known capacitors of this type is around 1 $fF/\mu m^2$; however, for future high-frequency applications, a multiple of this capacitance will be required. The surface area-specific capacitance of a capacitor is substantially determined by the thickness of the dielectric separating layer and the dielectric constant. Therefore, the surface area-specific capacitance of a capacitor can be increased by using dielectrics with a high dielectric constant (>8). Furthermore, insulation layers which are thinner than 60 nm lead to an increase in the surface area-specific capacitance.

SUMMARY OF THE INVENTION

Working on the basis of the prior art described, the invention is based on the object of providing an improved integrated semiconductor product having interconnects and a metal-insulator-metal capacitor and of describing a method for its fabrication.

This object can be achieved by an integrated semiconductor product comprising interconnects, which include copper as an essential constituent, and at least one metal-insulator-metal capacitor, which comprises a first electrode serving as a capacitor dielectric, a dielectric layer and a second electrode, wherein the first electrode is formed in a layer which is also provided as a layer for interconnects and the dielectric layer is arranged in an opening, arranged above the first electrode, in a dielectric auxiliary layer.

A dielectric protective layer can be arranged between the first electrode and the dielectric auxiliary layer, the opening also encompassing the dielectric protective layer. The dielectric protective layer may contain $Si_3N_4$. The dielectric layer may contain at least one of the following substances: $Al_2O_3$, $HfO_2$, $La_2O_3$, $Ta_2O_5$, $TiO_2$, $ZrO_2$ and all mixed oxides, oxynitrides and silicates thereof, $SrTiO_3$, $Ba_xSr_{1-x}TiO_3$ where $0 \leq x \leq 1$ (BST), $PbZr_xTi_{1-x}O_3$ where $0 \leq x \leq 1$ (PZT), $SiO_2$, $Si_3N_4$. The second electrode can be a stack comprising a metal layer and conductive barriers. The first electrode can be a stack comprising a metal layer and a conductive barrier. The barriers may contain at least one of the following substances: Ta, TaN, TiW, W, $WN_x$ where 0<x<2, Ti, TiN, silicides, carbides. The first electrode and/or the second electrode, in addition to the copper, may contain at least one of the following metals: Ai, Si, W, Au, Ag, Ti, Pt. The dielectric layer can be formed by a dielectric material with a dielectric constant of >8. The dielectric layer can be applied using one of the following processes: CVD, PECVD, MOCVD, PVD, ALD. The dielectric layer can be produced by an oxidation of the surface of the first electrode or by an oxidation of a layer on the first electrode. The thickness of the dielectric layer can be less than 60 nm. The surface area-specific capacitance of the capacitor can be at least 3 $fF/\mu m^2$.

The object can also be achieved by a method for fabricating an integrated semiconductor product with interconnects, which include copper as an essential constituent, and at least one metal-insulator-metal capacitor, which comprises a first electrode, a dielectric layer and a second electrode, comprising the following steps:

(a) forming the first electrode in a layer which is also intended as a layer for interconnects;

(b) applying a dielectric protective layer;

(c) applying a dielectric auxiliary layer;

(d) opening the dielectric protective layer and the dielectric auxiliary layer above the first electrode;

(e) forming the dielectric layer for the capacitor;

(f) forming the second electrode.

The photoresist which is used to pattern the opening may have already been incinerated before the first electrode is covered by the dielectric protective layer. Two conductive barriers and a metal layer arranged between them can be applied for the second electrode. One of the following processes can be used to produce the dielectric layer: CVD, PECVD, MOCVD, PVD, ALD. The surface of the first electrode or a layer on the first electrode can be oxidized in order to produce the dielectric layer. The dielectric auxiliary layer may become part of an upper intermetal dielectric which is deposited after the production of the second electrode. At least one upper interconnect can be connected to the capacitor through at least one via. The first electrode can be produced using a Damascene process. A conductive barrier can be applied to the first electrode before step (e). A conductive barrier can be applied selectively to the first electrode before step (e).

The invention, thus, provides an integrated semiconductor product with interconnects, which include copper as an essential constituent, and which has at least one metal-insulator-metal capacitor which comprises a first electrode, a dielectric layer and a second electrode. The dielectric layer is arranged in an opening, arranged above the first electrode, in a dielectric auxiliary layer.

The concept proposed here is suitable in particular, although not exclusively, for the integration of MIM capacitors with thin dielectrics without significantly altering the reliability of the other metal tracks. The reliability of the other metal tracks remains substantially unchanged, since in particular there are no residues of the dielectric capacitor layer on the other metal tracks. Moreover, the method according to the present invention is relatively uncritical to implement in terms of the individual process steps and allows greater degrees of freedom in the selection of materials and their thickness. In particular, the method according to the present invention has the advantage that via etches can be carried out significantly more easily than in the prior art, since it is not necessary to etch through the residual dielectric capacitor layer above the metal tracks.

The metal-insulator-metal capacitor has a first electrode, which is formed in a metal level for interconnects. Since the dielectric interlayer and the metallization layer for the second electrode can be kept thin, the metal-insulator-metal capacitor can be integrated without great difficulty in an existing concept for the fabrication of an integrated semiconductor product by means of the "Damascene" technique.

The metal-insulator-metal capacitor is expediently fabricated by applying a metal layer for interconnects to a substrate. Then, a dielectric protective layer and a dielectric auxiliary layer are deposited on the metal layer for interconnects. The dielectric auxiliary layer serves as a partial sacrificial layer and does not act as the MIM dielectric, but rather becomes part of the intermetal dielectric (IMD) which is subsequently applied. The known methods of lithography and etching are used to remove the dielectric protective layer and the dielectric auxiliary layer at the locations at which it is intended to integrate an MIM capacitor. It is preferable for the photoresist which is required in order to open up the two layers to have been incinerated even before the protective layer has been removed. In this case, it is particularly preferable if a corresponding etch stops selectively at the lower electrode. A dielectric layer made from material which can be selected as desired and with any desired thickness is deposited on the correspondingly patterned surface. Then, the materials which form the second electrode are applied and patterned appropriately.

This opens up the possibility of depositing an extremely thin dielectric layer by ALD (atomic layer deposition). Since no plasma excitation is used for this process, using ALD instead of PECVD provides a further alternative process for the deposition of oxidic or oxygen-containing layers without damaging the copper surface.

According to a further preferred embodiment of the method according to the invention, a conductive barrier is applied to the first electrode before step (e). In this context, it is particularly preferable if the conductive barrier is applied selectively only to the uncovered first electrode.

BRIEF DESCRIPTION OF THE DRAWINGS

An exemplary embodiment of the invention is explained below with reference to the appended drawings, in which.

DESCRIPTION OF THE INVENTION

Figure 1:
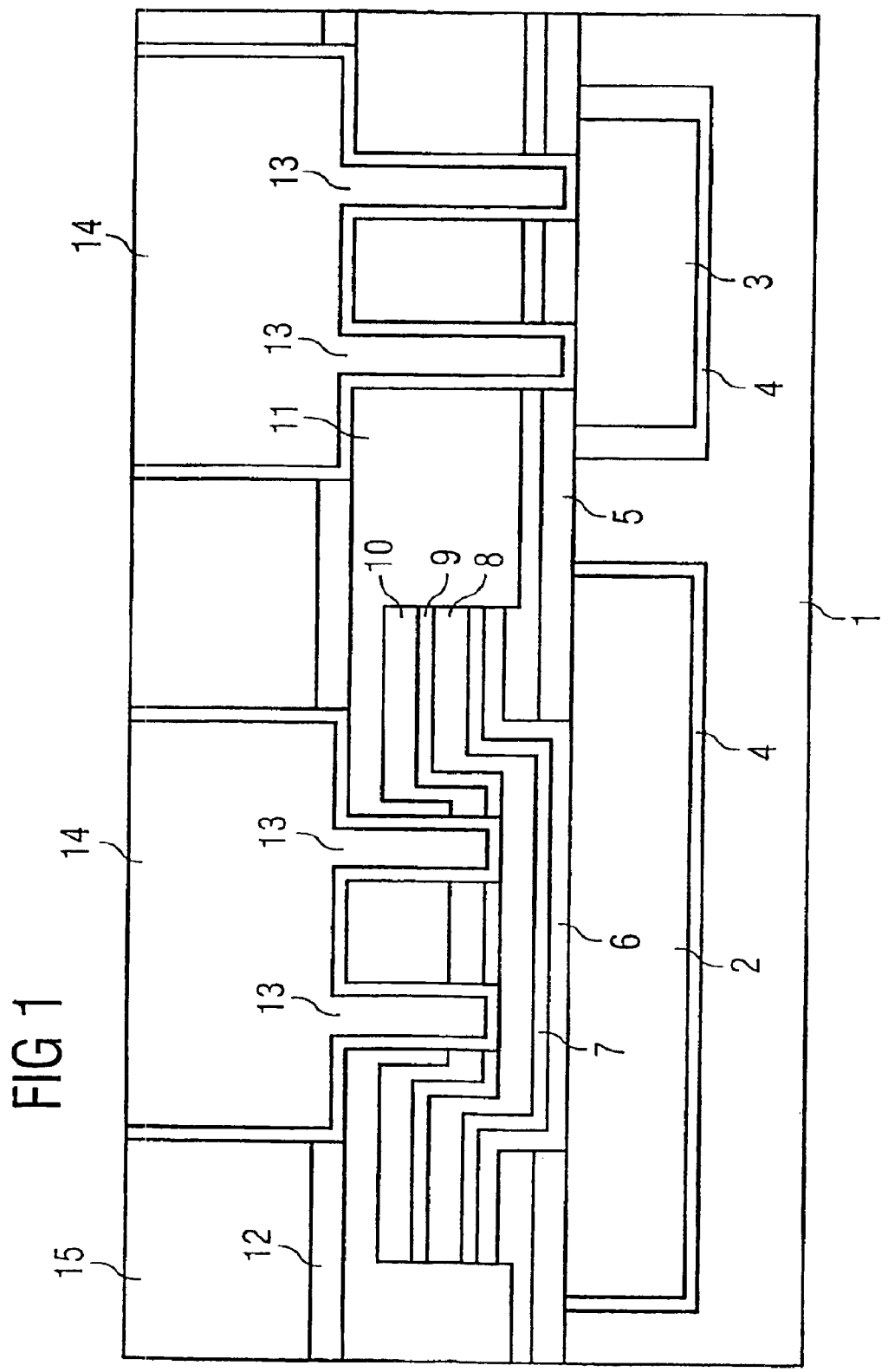
FIG. 1 shows an excerpt from a cross section through an integrated semiconductor product which includes a metal-insulator-metal capacitor, according to an exemplary embodiment of the invention.
Figure 2:
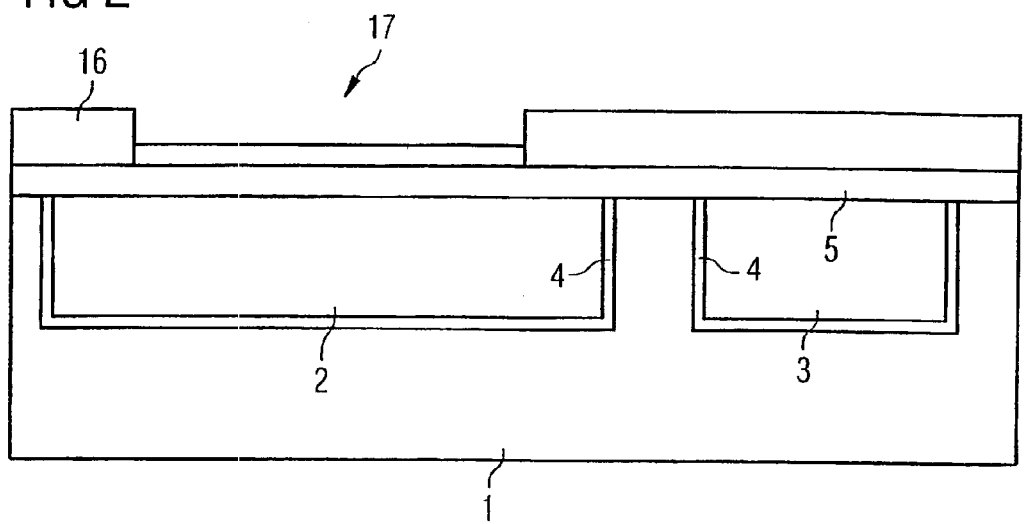
FIG. 2 shows an excerpt of a cross section through an integrated semiconductor product according to an exemplary embodiment of the present invention in a first process stage, in which a dielectric auxiliary layer has already been opened up above the first electrode.

FIG. 2 shows a metal track in a "Damascene" architecture with an interconnect 3 made from Cu as it is also used in the corresponding prior art. The interconnect 2 is also to function as the lower MIM electrode. A dielectric protective layer 5 of $Si_3N_4$ is deposited on the metal track. Then, a dielectric auxiliary layer 16 of $SiO_2$, with a thickness of approx. 50–100 nm, is deposited on this protective layer using known processes which are compatible with metallization. It serves as a partial sacrificial layer and does not act as an MIM dielectric, but rather becomes part of the intermetal dielectric (IMD) applied subsequently. Using the known methods of lithography and etching, the dielectric auxiliary layer is removed at the location 17 at which it is intended to integrate an MIM capacitor. After the auxiliary layer 16 has been removed, the photoresist used to pattern the opening is incinerated. The first electrode 2 is protected by the protective layer 5 during the incineration. A further interconnect 3 is protected during the incineration both by the residual auxiliary layer 16 and by the protective layer 5. Then, any residue of $SiO_2$ auxiliary layer which remains in the opening and the protective layer 5 are removed. The partially removed auxiliary layer 16 serves as a hard mask for the opening.

Figure 3:
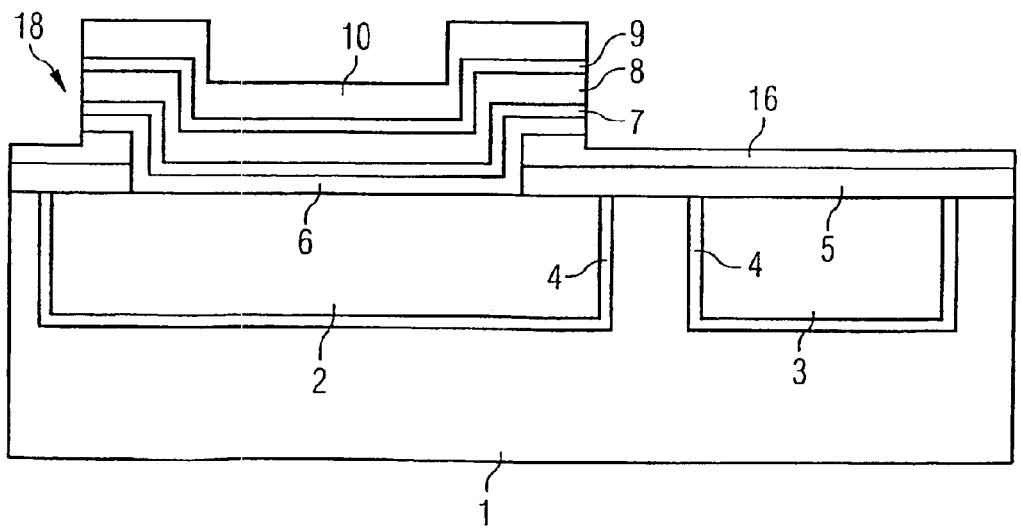
FIG. 3 shows an excerpt from a cross section through an integrated semiconductor product according to an exemplary embodiment of the present invention in a second process stage, in which the capacitor stack has already been patterned.
Figure 4:
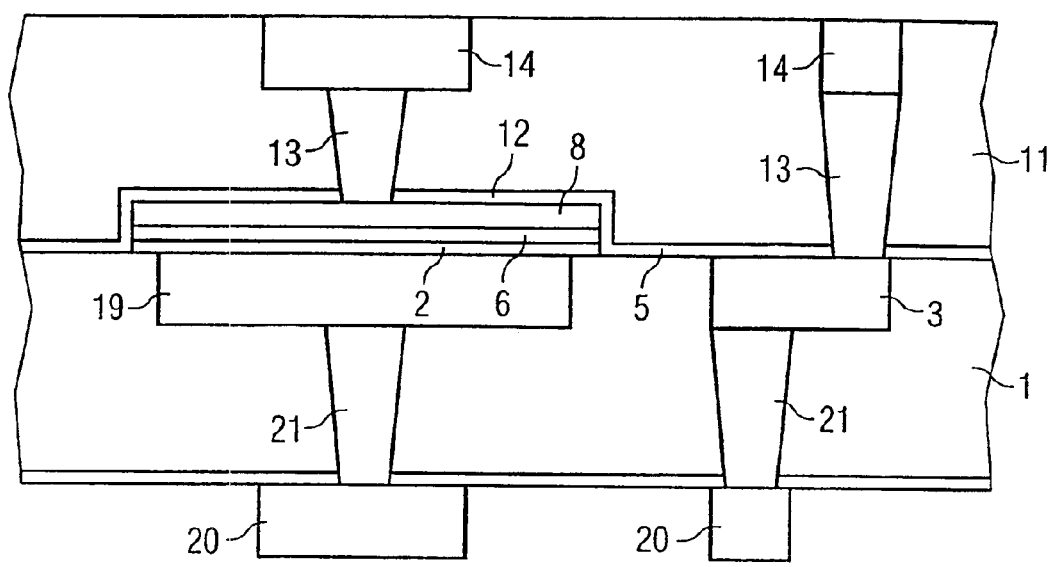
FIG. 4 shows an excerpt from a cross section through an MIM capacitor produced using the "Damascene" technique in accordance with the prior art.

FIG. 3 shows the MIM capacitor after the deposition and patterning of the MIM dielectric 6, of the upper electrode 7, 8, 9 and of a passivation layer 10 have taken place. After the dielectric auxiliary layer 16 and the protective layer 5 have been opened up, a dielectric layer 6, for example of $Al_2O_3$, with a thickness of 20 nm is produced. However, this is not imperative, since the dielectric 6 can be selected as desired and can be deposited in any desired thickness. Furthermore, a conductive barrier, (not shown), for example TaN, can be applied to the first electrode prior to the deposition of the dielectric. It is particularly preferable if the conductive barrier is applied selectively only to the uncovered first electrode.

Since, according to this exemplary embodiment, an integration route does not impose any minimum demands on the thickness, etching properties and other properties of the dielectric layer 6, any desired processes can be used to produce it, such as CVD, PECVD, MOCVD and PVD, provided that the layers can be produced at temperatures below 400° C. The dielectric layer 7 can also be produced with the aid of oxidation of the surface of the lower electrode or with the aid of oxidation of a layer provided for this purpose (e.g. Ta and/or TaN) on the lower electrode. Furthermore, it is possible for the dielectric layer 6 to be deposited by ALD (atomic layer deposition). This process makes it possible to produce extremely thin layers by means of atomic layer deposition. The process according to the invention makes it possible to achieve capacitors with specific capacitances of 3 $fF/pm^2$ to well above 10 $fF/pm^2$, which with the previous approaches it was impossible to produce reproducibly in sufficient quality.

Deposition by means of ALD provides an alternative process to PECVD allowing deposition of oxidic or oxygen-containing layers. Since ALD does not use any plasma excitation whatsoever, the sensitive copper surface of the first electrode and therefore the quality of the capacitor are not degraded.

Then, the materials for the upper electrode are applied. These comprise conductive barriers 7, 9 which may, for example, contain TiN. Between them, there is a metallic layer 8, which may, for example, contain AlCu. The topology produced by the previous opening 17 in the dielectric auxiliary layer 16 is relatively small: the edge length of the lower electrodes is greater than 1 $\mu$m, and the step height is approx. 50–100 nm. Therefore, the topology can be well covered by the selected deposition processes. A passivation layer 10 of $Si_3N_4$ is also deposited on the upper conductive barrier 9.

This is followed by the etching of the stack comprising the passivation layer 10, the upper electrode 7, 8, 9, the dielectric layer 6 and the auxiliary layer 16. In this context, no particular demands are imposed on the residual thickness of the dielectric auxiliary layer 16 which remains on the protective layer 5 and therefore on the selectivity of the etching process. As a result, unlike with the concepts which have been described and similar concepts, there is a very wide process window for the entire procedure combined, at the same time, with a free choice of the dielectric 6 and its thickness.

Next, an upper intermetal dielectric 11 is deposited. Any residues of the dielectric auxiliary layer 16 then simply become part of this IMD 11. Vias 13 are formed in order to make contact with the capacitor and the lower interconnect 3 and these vias are connected at their upper end to upper interconnects 13. These upper interconnects 14 are in turn embedded in an intermetal dielectric 15. The via etches can be carried out significantly more easily than in the prior art, since there is no need to etch through the residual dielectric capacitor layer above the metal tracks.

In this exemplary embodiment, all the interconnects and vias have been formed by means of the "Damascene" technique.

The metallization and plate capacitor materials described in the above exemplary embodiment are given by way of example without implying any limitation. In particular, all conductive materials, such as Si, W, Cu, Ag, Au, Ti, Pt and alloys thereof, can be used as interconnects. In addition to Ti and TiN, TiW, W, $WN_x$ where $0 \leq x \leq 2$, Ta, TaN, silicides and carbides are also particularly suitable as alternative barriers or liner layers. All the abovementioned materials and combinations thereof can be used as electrodes. In addition to the conventional dielectrics used in semiconductor technology, namely $SiO_2$ and $Si_3N_4$, the full range of materials with a significantly higher k is available, in particular $Al_2O_3$, $ZrO_2$, $HfO_2$, $Ta_2O_5$, $L_2O_3$, $TiO_2$ and the mixed oxides, oxynitrides and silicates thereof, $SrTiO_3$, $Ba_xSr_{1-x}TiO_3$ where $0 \leq x \leq 1$ (BST) and $PbZr_xTi_{1-x}O_3$ where $0 \leq x \leq 1$ (PZT).

We claim:

1. An integrated semiconductor product comprising interconnects, which include copper as an essential constituent, and at least one metal-insulator-metal capacitor, which comprises a first electrode, a dielectric layer serving as a capacitor dielectric and a second electrode, wherein the first electrode is formed in a layer which is also provided as a layer for interconnects and the dielectric layer is arranged in an opening, arranged above the first electrode, in a dielectric auxiliary layer, and wherein the total height of the second electrode and the dielectric layer is smaller than a thickness of an intermetal dielectric disposed on the layer which is also provided for as a layer for interconnects.

2. The semiconductor product as claimed in claim 1, wherein a dielectric protective layer is arranged between the first electrode and the dielectric auxiliary layer, the opening also encompassing the dielectric protective layer.

3. The semiconductor product as claimed in claim 1, wherein the dielectric protective layer contains $Si_3N_4$.

4. The semiconductor product as claimed in claim 1, wherein the dielectric layer contains at least one of the following substances from the group consisting of: $Al_2O_3$, $HfO_2$, $La_2O_3$, $Ta_2O_5$ $TiO_2$, $ZrO_2$ and all mixed oxides, oxynitrides and silicates thereof, $SrTiO_3$, $Ba_xSr_{1-x}TiO_3$ where $0 \leq x \leq 1$ (BST), $PbZr_xTi_{1-x}O_3$ where $0 \leq x \leq 1$ (PZT), $SiO_2$, $Si_3N_4$.

5. The semiconductor product as claimed in claim 1, wherein the second electrode is a stack comprising a metal layer and conductive barriers.

6. The semiconductor product as claimed in claim 1, wherein the first electrode is a stack comprising a metal layer and a conductive barrier.

7. The semiconductor product as claimed in claim 5, wherein the barriers contain at least one of the following substances from the group consisting of: Ta, TaN, TiW, W, $WN_x$ where $0 < x < 2$, Ti, TiN, silicides, carbides.

8. The semiconductor product as claimed in claim 6, wherein the barriers contain at least one of the following substances from the group consisting of: Ta, TaN, TiW, W, $WN_x$ where $0 < x < 2$, Ti, TiN, silicides, carbides.

9. The semiconductor product as claimed in claim 1, wherein the first electrode and/or the second electrode, in addition to the copper, contains at least one of the following metals from the group consisting of: Ai, Si, W, Au, Ag, Ti, Pt.

10. The semiconductor product as claimed in claim 1, wherein the dielectric layer is formed by a dielectric material with a dielectric constant of >8.

11. The semiconductor product as claimed in claim 1, wherein the dielectric layer is applied using one of the following processes from the group consisting of: CVD, PECVD, MOCVD, PVD, ALD.

12. The semiconductor product as claimed in claim 1, wherein the dielectric layer is produced by an oxidation of the surface of the first electrode or by an oxidation of a layer on the first electrode.

13. The semiconductor product as claimed in claim 1, wherein the thickness of the dielectric layer is less than 60 nm.

14. The semiconductor product as claimed in claim 1, wherein the surface area-specific capacitance of the capacitor is at least 3 $fF/\mu m^2$.

* * * * *